United States Patent [19]

Wakino et al.

[11] 4,388,600
[45] Jun. 14, 1983

[54] SURFACE ACOUSTIC WAVE DEVICE

[75] Inventors: Kikuo Wakino, Muko; Michio Kadota, Kyoto; Tomoharu Sato, Takatsuki, all of Japan

[73] Assignee: Murata Manufacturing Co., Ltd., Japan

[21] Appl. No.: 245,065

[22] Filed: Mar. 18, 1981

[30] Foreign Application Priority Data

Mar. 22, 1980 [JP] Japan ................................. 55-36688

[51] Int. Cl.³ ...................... H03H 9/145; H03H 9/42
[52] U.S. Cl. ............................... 333/151; 310/313 R; 333/194
[58] Field of Search ............................... 333/150–155, 333/193–196; 310/313 R, 313 A, 313 B, 313 C, 313 D; 330/4.9, 5.5; 331/107 A; 29/25.35

[56] References Cited

U.S. PATENT DOCUMENTS

| 3,887,887 | 6/1975 | Wagers et al. | 29/25.35 X |
| 3,931,598 | 1/1976 | Bongianni | 333/150 |
| 4,012,650 | 3/1977 | Pratt et al. | 333/151 X |

Primary Examiner—Marvin L. Nussbaum
Attorney, Agent, or Firm—Ostrolenk, Faber, Gerb & Soffen

[57] ABSTRACT

A surface acoustic wave device includes a piezoelectric substrate having opposite flat surfaces. On one surface of the substrate, there are provided launching transducer for launching acoustic waves and receiving transducer for receiving the launched acoustic waves. On the other surface of the substrate, there are provided a plurality of grooves aligned in an angled relation with the direction of propagation of the acoustic waves. The grooves are divided into two or more groups in which the depth of the grooves in one group is different from that in any other group.

15 Claims, 12 Drawing Figures

SURFACE ACOUSTIC WAVE DEVICE

The present invention relates to a surface acoustic wave (SAW) device and, more particularly, to an arrangement of the SAW device capable of suppressing the bulk acoustic waves.

Generally, the SAW device comprises a transmitting, or launching, transducer and a receiving transducer, both being formed by comb-like multi-electrode elements, having their teeth interdigitated, and disposed on a piezoelectric substrate, such as PZT piezoelectric ceramic substrate, single crystal LiNbO$_3$ substrate or ZnO wafer deposited on a glass plate. When an alternating electrical potential is applied to the electrodes of the transmitting transducer, an alternating electric field is generated that causes localized vibration in the substrate. These vibrations give rise to surface acoustic waves, which propagate along the surface of the substrate in a path defined orthogonal to the electrodes, and may be detected at any point along the path by the receiving transducer. In addition to the surface acoustic waves, the localized vibrations also give rise to bulk acoustic waves, which travel through the piezoelectric material, reflected once or several times on the surfaces of the piezoelectric substrate, and may be detected at the receiving transducer as a spurious response in the frequency characteristic.

In order to eliminate such bulk acoustic waves, there have been proposed various SAW devices and, one of which is disclosed in U.S. Pat. No. 3,980,904 issued Sept. 14, 1976 to Onodera et al. Onodera et al. teaches an elastic surface wave device in which the piezoelectric body employed therein has at least one groove formed in a surface opposite to the surface on which the conductor, i.e., interdigitated electrode, is formed. The groove is elongated in a direction in which a surface wave is propagated and, at least a part of the groove is located in a portion of the body corresponding to the input conduction so as to interact with a surface wave and suppress spurious responses.

Another prior art SAW device is disclosed in Japanese Patent laid-open publication (Offenlegungschrift) No. 98552/1974 published on Sept. 18, 1974. According to this publication, the piezoelectric body has a plurality of grooves formed in a surface opposite to the surface on which the interdigitated electrodes are formed in such a manner that grooves extend in a direction perpendicular or slanted relation with the direction of travel of the acoustic waves and have depth approximately equal to or more than the wavelength of the unwanted bulk waves. The distance between the grooves can be fixed to a constant distance or can be varied.

Both of the prior art SAW devices mentioned above may suppress the unwanted bulk waves to some degrees but are not sufficient for the bulk waves that appear in the upper side cutoff frequency region. For example, in the case of SAW device employed in a television receiver as a video intermediate frequency (VIF) filter, the prior art SAW devices cannot suppress the unwanted bulk waves in the adjacent sound carrier(fas) frequency region. Accordingly, there has been such a disadvantage that the attenuation at the fas frequency region can not be obtained to a desired degree.

Accordingly, it is a primary object of the present invention to provide a surface acoustic wave device which can suppress the unwanted bulk waves in the upper side cutoff frequency region.

It is another object of the present invention to provide a surface acoustic wave device of the above described type which is simple in construction and can readily be manufactured at low cost.

In accomplishing these and other objects, a surface acoustic wave device according to the present invention comprises a substrate having first and second flat surfaces which are in face-to-face relation with each other. The substrate is made of a material capable of propagating acoustic waves along the first flat surface, and is formed with a plurality of grooves in the second flat surface in an angled relation with the direction of propagation of the acoustic waves. The grooves are divided into at least two groups in which the depth of the grooves in the first group is different from that in the second group. The surface acoustic wave device of the present invention further comprises first and second transducers deposited on the first flat surface for launching and receiving the acoustic waves.

These and other objects and features of the present invention will become apparent from the following description taken in conjunction with preferred embodiments thereof with reference to the accompanying drawings, throughout which like parts are designated by like reference numerals, and in which.

Figure 1:
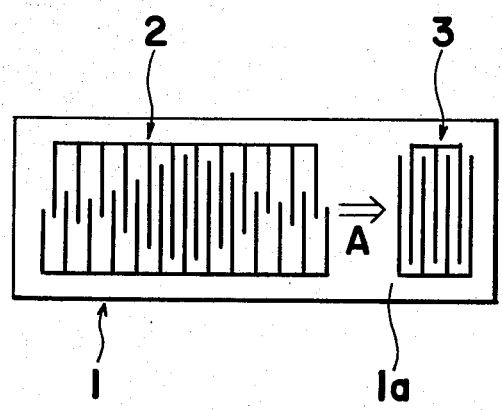
FIG. 1 is a top plan view of a surface acoustic wave device of the present invention.

Referring to FIG. 1, a surface acoustic wave (SAW) device according to the present invention comprises an elongated rectangular substrate 1 of a piezoelectric material, such as PZT, single crystal of LiNbO$_3$ or ZnO. In the case where the substrate 1 is formed by ZnO, it is preferable to present the ZnO in a form of wafer and deposite the wafer of ZnO on a glass plate. The rectangular substrate 1 has a transmitting transducer 2 and a receiving transducer 3 both applied to upper main surface 1a of the substrate 1 in a known manner. The transmitting transducer 2 includes a pair of thin-film metal electrodes arranged in a shape of combs with interdigitated teeth. The tips of the comb-shaped electrodes of the transmitting transducer 2 are arranged in accordance with a desired mathematical weighting function. In the embodiment shown, the teeth of the transmitting transducer 2 are arranged in a so-called, apodized arrangement. The receiving transducer 3 includes a pair of comb-shaped electrodes of the uniform overlap, or interdigitated, type.

The SAW device of the above described type is used, for example, as a video intermediate frequency (VIF) filter for a television receiver.

In operation, when an alternating electric potential is applied to the electrodes of the transmitting transducer 2, an alternating electric field is generated that causes localized vibration in the substrate for launching acoustic waves that propagate along the surface of the substrate 1 in a path orthogonal to the electrodes, as shown by an arrow A. The launched acoustic waves are detected by the receiving transducer 3.

Figure 2:
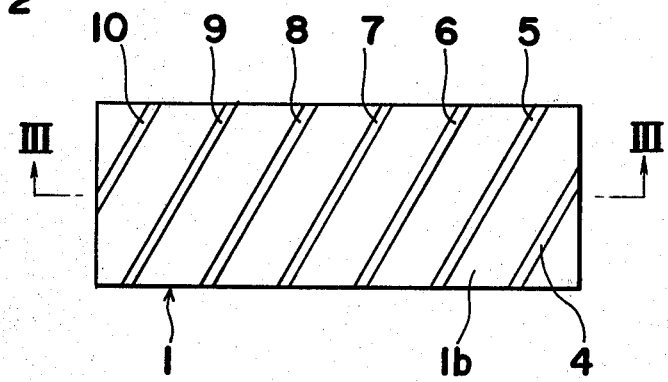
FIG. 2 is a bottom plan view of the surface acoustic wave device of FIG. 1.
Figure 3:
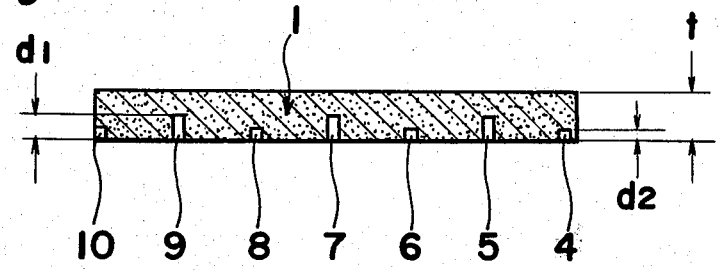
FIG. 3 is a cross-sectional view taken along a line III—III shown in FIG. 2.

Referring particularly to FIGS. 2 and 3, the SAW device of the present invention further has a plurality of grooves 4, 5, 6, 7, 8, 9 and 10 formed by any known method, such as, by using the diamond cutter or rutter, in lower main surface 1b, which is opposite to the surface 1a provided with the transducers 2 and 3. The grooves 4 to 10 are formed in parallel relation with each other with a predetermined distance spaced from each other and are preferably slanted a predetermined angle with respect to the direction A of propagation of the acoustic waves. The depth of the grooves 4 to 10 are changed alternately between shallow and deep. In the arrangement shown in FIG. 3, the grooves designated by even numbers 4, 6, 8 and 10 have depth d2 and the grooves designated by odd numbers 5, 7 and 9 have depth d1, which is greater than the depth d2.

According to the above described arrangement, the bulk acoustic waves that propagate through the substrate 1 are reflected at irregular bottom surface formed by deep and shallow grooves 4 to 10 so that the bulk acoustic waves are effectively suppressed before they reach the receiving transducer 3.

The tests carried out by the present inventors is explained below.

Figure 4:
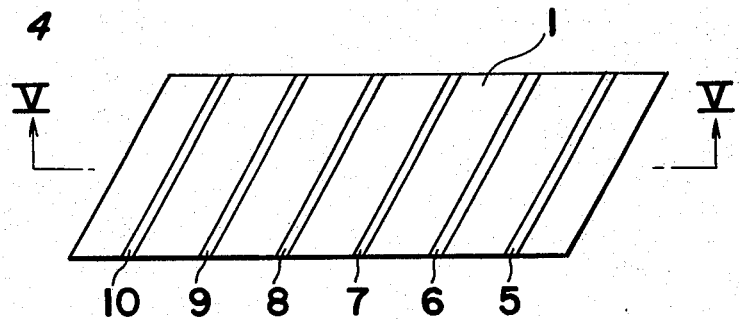
FIG. 4 is a bottom plan view of a surface acoustic wave device used in the tests.
Figure 5:
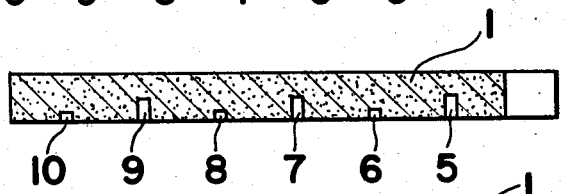
FIG. 5 is a cross-sectional view taken along a line V—V shown in FIG. 4, particularly showing the groove arrangement according to the present invention.
Figure 6:
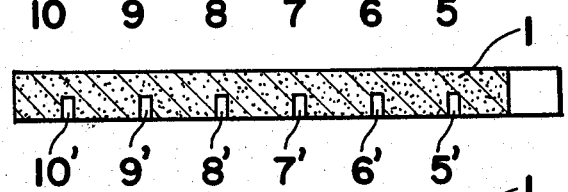
FIGS. 6 and 7 are views similar to FIG. 5, but particularly show groove arrangement according to the prior art.
Figure 7:
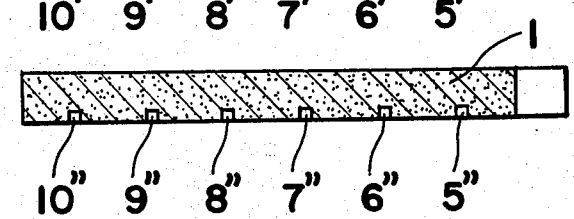

In the tests, eighteen sets of SAW devices are employed, each formed by a 0.7 mm thick PZT substrate 1 having a parallelogram shape, as shown in FIG. 4, with transducer 2 and 3 arranged in a manner shown in FIG. 1 to constitute a VIF filter having a central frequency around 36.5 MHz. The eighteen sets of SAW devices are divided into three groups, each including six sets. The SAW devices in the first group are formed with six grooves 5 to 10 which are aligned alternately of deep groove having a depth of 0.35 mm and width of 0.2 mm, and shallow groove having a depth of 0.15 mm and width of 0.2 mm, as shown in FIG. 5. The grooves 5 to 10 are aligned with a pitch of 0.9 mm and are slanted 60° with respect to the direction A of the acoustic wave propagation. The SAW devices in the second and third groups are formed with six grooves in a similar manner to that described above but all having the same depth. More particularly, the SAW devices in the second group have grooves 5' to 10' with a depth of 0.35 mm, as shown in FIG. 6, and the SAW devices in the third group have grooves 5" to 10" with a depth of 0.15 mm, as shown in FIG. 7.

In order to evaluate the degree of suppress of the bulk acoustic waves in the fas frequency region, a bonding agent is applied entirely on the surface 1a of the substrate 1 to completely suppress the surface acoustic waves and to allow only the bulk acoustic waves to pass through the substrate 1. Then the degree of attenuation of bulk acoustic waves in each test piece at the fas frequency region is measured by taking a ratio of signal level, at the fas frequency, between the signal applied to the transmitting transducer 2 and the signal obtained from the receiving transducer 3. The obtained ratio, referred to as a BAW ratio, is expressed in decibel unit (dB). From the practical point of view, the obtained BAW ratio is plotted in a graph in consideration of attenuation of surface acoustic waves at its peak level. More specifically, prior to the application of the bonding agent, the attenuation of wanted surface acoustic surface waves at its peak level, i.e., approximately at the central frequency, is measured in a manner similar to that described above to obtain the ratio of surface acoustic waves, referred to as SAW ratio. Since SAW ratio showed approximately equal value to all the test pieces, it can be considered as a constant. Then, (BAW ratio-SAW ratio) is calculated to consider the level of SAW ratio as the zero level for the BAW ratio, and the calculated value is plotted in the graph.

Figure 8:
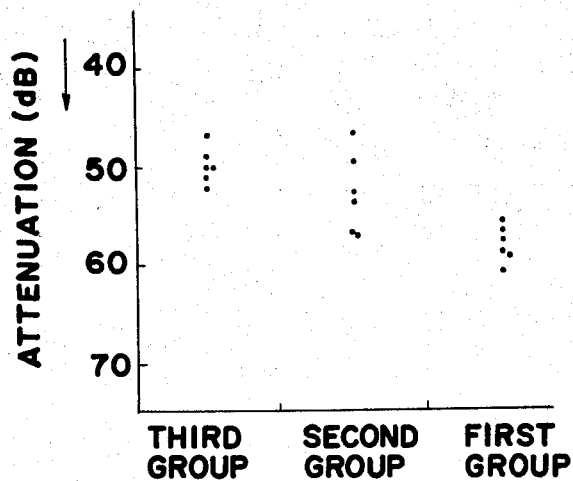
FIG. 8 is a graph showing the result of tests carried out by the use of surface acoustic wave devices of FIGS. 4 to 7.

The result of the tests is shown in a graph of FIG. 8 in which ordinate represents attenuation (dB) obtained at fas frequency region and abscissa is divided into three sections to plot the result of the tests in each group in one section. The SAW devices in the first group, prepared according to the present invention, showed attenuation of 56 dB or more with mean value x=58.6 dB and standard deviation $\sigma=1.9$ dB. The SAW devices in the second group, representing one type of prior art SAW device, showed attenuation of 47 dB or more with mean value x=52.9 dB and standard deviation $\sigma=3.7$ dB. The SAW devices in the third group, representing another type of prior art SAW device, showed attenuation of 47 dB or more with means value x=50.0 dB and standard deviation $\sigma=1.7$ dB.

As apparent from the tests, the SAW devices in the first group, representing the SAW devices of the present invention, showed more improved attenuation in the fas frequency region than the SAW devices in the second and third groups. When the SAW devices in the second and third groups are compared, it can be said that the depth of the groove improves the attenuation in the fas frequency such that the deeper the depth, better the attenuation. However, according to the present invention, it has been found that the improvement of attenuation obtained by the combination of deep grooves and shallow grooves is much better than that obtained by merely changing the depth of the grooves.

Figure 9:
FIGS. 9 to 12 are views similar to FIG. 3, but particularly show modifications of the surface acoustic wave device of the present invention.
Figure 10:

In the preferred embodiment described above, it has been described that the deep grooves and shallow grooves are aligned alternately one-by-one. It is to be noted, however, that the deep grooves and shallow grooves may be aligned in any desired alignment, such as, two-by-two as shown in FIG. 9, or three-by-three as shown in FIG. 10, or any other irregular alignment.

Figure 11:
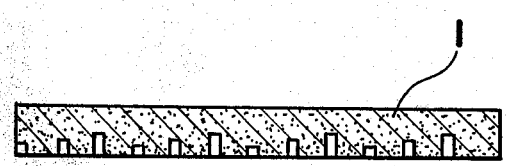
Figure 12:
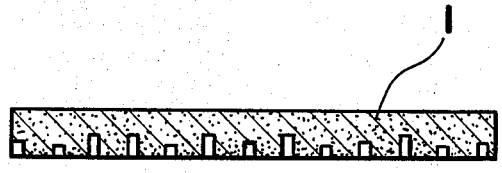

Furthermore, in the above described embodiment, it has been described that the grooves are arranged with two different types of grooves, i.e., deep grooves and shallow grooves. It is to be noted, however, that the grooves can be arranged with more than two, such as, three, different types of grooves i.e., deep, intermediate and shallow grooves, as shown in FIG. 11 or 12.

Moreover, the width and/or pitch of the grooves can be changed to any desired value.

Although the present invention has been fully described with reference to the preferred embodiment, many modifications and variations thereof will now be apparent to those skilled in the art, and the scope of the present invention is therefore to be limited not by the details of the preferred embodiment described above, but only by the terms of appended claims.

What is claimed is:

1. A surface acoustic wave device comprising:

a substrate having first and second oppositely facing flat surfaces, said substrate being made of a material capable of propagating acoustic waves along said first flat surface;

a first transducer for launching acoustic waves and a second transducer for receiving acoustic waves launched by said first transducer, said first and second transducers being deposited on said first flat surface;

said substrate being formed with a plurality of elongated grooves in said second flat surface in an angled relation with the direction of propagation of said acoustic waves and with groove length greatly exceeding groove depth, said grooves being divided into at least two groups in which the depth of the grooves in the first group is different from that in the second group.

2. A surface acoustic wave device as claimed in claim 1, wherein said grooves of the first group and said grooves of the second group are aligned alternately one-by-one.

3. A surface acoustic wave device as claimed in claim 2, wherein said grooves are continuous and extend parallel to each other.

4. A surface acoustic wave device as claimed in claim 1, wherein said grooves of the first group and said grooves of the second group are aligned alternately two-by-two.

5. A surface acoustic wave device as claimed in claim 4, wherein said grooves are continuous and extend parallel to each other.

6. A surface acoustic wave device as claimed in claim 1, wherein said grooves of the first group and said grooves of the second group are aligned alternately three-by-three.

7. A surface acoustic wave device as claimed in claim 6, wherein said grooves are continuous and extend parallel to each other.

8. A surface acoustic wave device as claimed in claim 1, wherein said grooves of the first group and said grooves in the second group are aligned irregularly.

9. A surface acoustic wave device as claimed in claim 8, wherein said grooves are continuous and extend parallel to each other.

10. A surface acoustic wave device as claimed in claim 1, wherein said grooves are divided into three groups in which the grooves in the first group are deeper than those in the second group and the grooves in the second group are deeper than those in the third group.

11. A surface acoustic wave device as claimed in claim 10, wherein said grooves are continuous and extend parallel to each other.

12. A surface acoustic wave device as claimed in claim 1, wherein said grooves are divided into a plurality of groups in which the depth of the grooves in one group is different from that in any other group.

13. A surface acoustic wave device as claimed in claim 12, wherein said grooves are continuous and extend parallel to each other.

14. A surface acoustic wave device as claimed in claim 1, wherein said grooves are continuous and extend parallel to each other.

15. A surface acoustic wave device as claimed in claim 14, wherein spacing between adjacent ones of said grooves exceeds groove depth.

* * * * *